United States Patent

Droopad et al.

(10) Patent No.: US 7,692,224 B2
(45) Date of Patent: Apr. 6, 2010

(54) MOSFET STRUCTURE AND METHOD OF MANUFACTURE

(75) Inventors: Ravindranath Droopad, Chandler, AZ (US); Matthias Passlack, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 271 days.

(21) Appl. No.: 11/864,274

(22) Filed: Sep. 28, 2007

(65) Prior Publication Data

US 2009/0085073 A1  Apr. 2, 2009

(51) Int. Cl.
*H01L 29/78* (2006.01)
*H01L 21/336* (2006.01)

(52) U.S. Cl. .............. 257/288; 438/285; 438/779; 257/E21.409; 257/E29.255

(58) Field of Classification Search ........ 257/288; 438/285, 779
See application file for complete search history.

(56) References Cited

U.S. PATENT DOCUMENTS 6,963,090 B2  11/2005  Passlack et al.
6,989,556 B2  1/2006  Braddock
7,221,025 B2 *  5/2007  Xiang ............... 257/347
2009/0152620 A1 *  6/2009  Ahn et al. ........... 257/324

OTHER PUBLICATIONS

Ren, F. et al., "Ga2O3(Gd2O3)/InGaAs Enhancement-Mode n-Channel MOSFET's"; IEEE Electron Device Letters; Aug. 1998; pp. 369-311; vol. 19, No. 8; IEEE.

* cited by examiner

*Primary Examiner*—W. David Coleman
*Assistant Examiner*—Christine Enad

(57) ABSTRACT

A method of forming a portion (10) of a compound semiconductor MOSFET structure comprises forming a compound semiconductor layer structure (14) and an oxide layer (20) overlying the same. Forming the compound semiconductor structure (14) includes forming at least one channel material (16) and a group-III rich surface termination layer (18) overlying the at least one channel material. Forming the oxide layer (20) includes forming the oxide layer to overlie the group-III rich surface termination layer and comprises one of (a) depositing essentially congruently evaporating oxide of at least one of (a(i)) a ternary oxide and (a(ii)) an oxide more complex than a ternary oxide and (b) depositing oxide molecules, with use of at least one of (b(i)) a ternary oxide and (b(ii)) an oxide more complex than a ternary oxide.

20 Claims, 3 Drawing Sheets

MOSFET STRUCTURE AND METHOD OF MANUFACTURE

BACKGROUND

1. Field

This disclosure relates generally to semiconductor devices, and more specifically, to MOSFET devices featuring a ternary oxide overlying a compound semiconductor surface, and more specifically, an indium-containing or gallium-containing compound semiconductor surface and method of making the same.

2. Related Art

State of the art compound semiconductor metal-oxide-semiconductor field effect transistors (MOSFETs) are known to be fabricated with a gate dielectric stack that consists of a $Ga_2O_3$ template layer with a GdGaO layer on top of GaAs-based devices. The $Ga_2O_3$ layer serves to unpin the semiconductor Fermi level and the GdGaO provides a high resistivity layer with the required conduction band offsets to reduce gate leakage. However, for indium phosphide based (InP-based) devices that have enhanced properties due to the higher mobility of high In composition in the InGaAs channel layers leading to higher drive current and frequency, a suitable gate dielectric for the InGaAs/InP system is lacking. Similarly, for indium antimonide based (InSb-based) devices that have enhanced properties due to their higher mobility leading to higher drive current and operating frequency, a suitable gate dielectric for Sb-containing compound semiconductor system is lacking.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
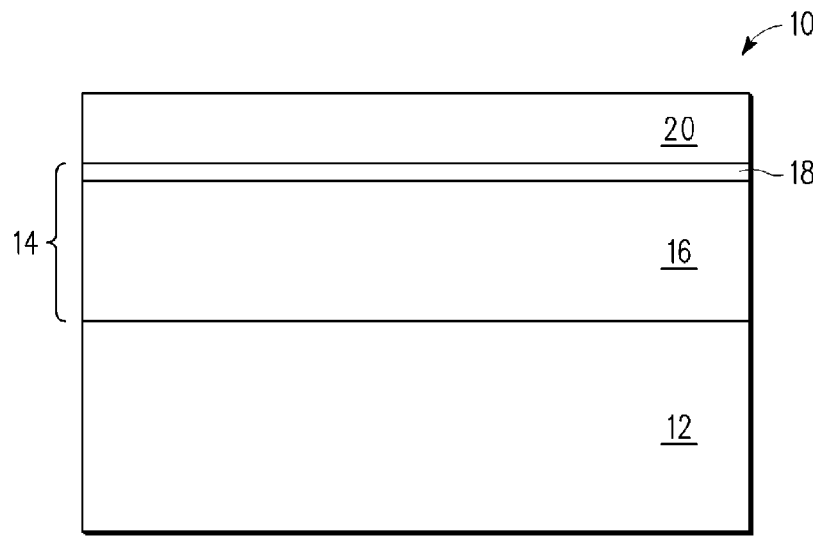
FIG. 1 is a schematic view, in cross section, of a compound semiconductor structure in accordance with one exemplary embodiment of the present disclosure.

FIG. 1 is a schematic view, in cross section, of a compound semiconductor structure 10 in accordance with one exemplary embodiment of the present disclosure. Structure 10 includes a semiconductor substrate 12 and a semiconductor layer structure 14 overlying the substrate. Semiconductor substrate 12 can comprise any semiconductor material or combinations of materials, such as gallium arsenide, indium phosphide, indium antimonide, gallium nitride, silicon germanium, silicon-on-insulator (SOI), germanium-on-insulator (GOI), monocrystalline silicon, the like, and combinations of the above. The semiconductor layer structure 14 includes a number of layers which comprise the bulk or majority, as represented by reference numeral 16, of the semiconductor layer structure 14. In one embodiment, the layers comprise epitaxial layers. Semiconductor layer structure 14 further includes a surface termination layer 18 that comprises a surface portion of the semiconductor layer structure 14. In one embodiment, surface termination layer 18 comprises a surface termination layer having a group III-rich surface in the case of a III-V compound semiconductor. The semiconductor layer structure 14 also includes a portion of which acts as a channel of the device structure 10. For example, in one embodiment, the semiconductor layer structure 14 includes combinations of InGaAs and InAlAs layers, wherein the channel comprises InGaAs.

The surface termination layer 18 can include a mono-layer (ML), a fraction of a mono-layer, or any portion of a mono-layer. In one embodiment, the surface termination layer 18 comprises a group III-rich surface termination layer. The reason for the surface termination layer being group-III rich is that, in the embodiment of the semiconductor layer structure 14 containing InGaAs, the surface termination layer contains a combined indium (In) and gallium (Ga) content of greater than fifty percent (>50%). In other words, it is possible for the surface atoms to comprise substantially all indium and gallium atoms (possibly up to 100%), and thus the surface termination layer 18 is characterized as having an indium and gallium content greater than 50%. The quantity of combined indium and gallium atoms on the surface is a function of the amount of indium and gallium content within the surface termination layer. In addition, an oxide layer 20 overlies the surface termination layer 18. In one embodiment, oxide layer 20 comprises a ternary oxide, as discussed further herein.

Figure 2:
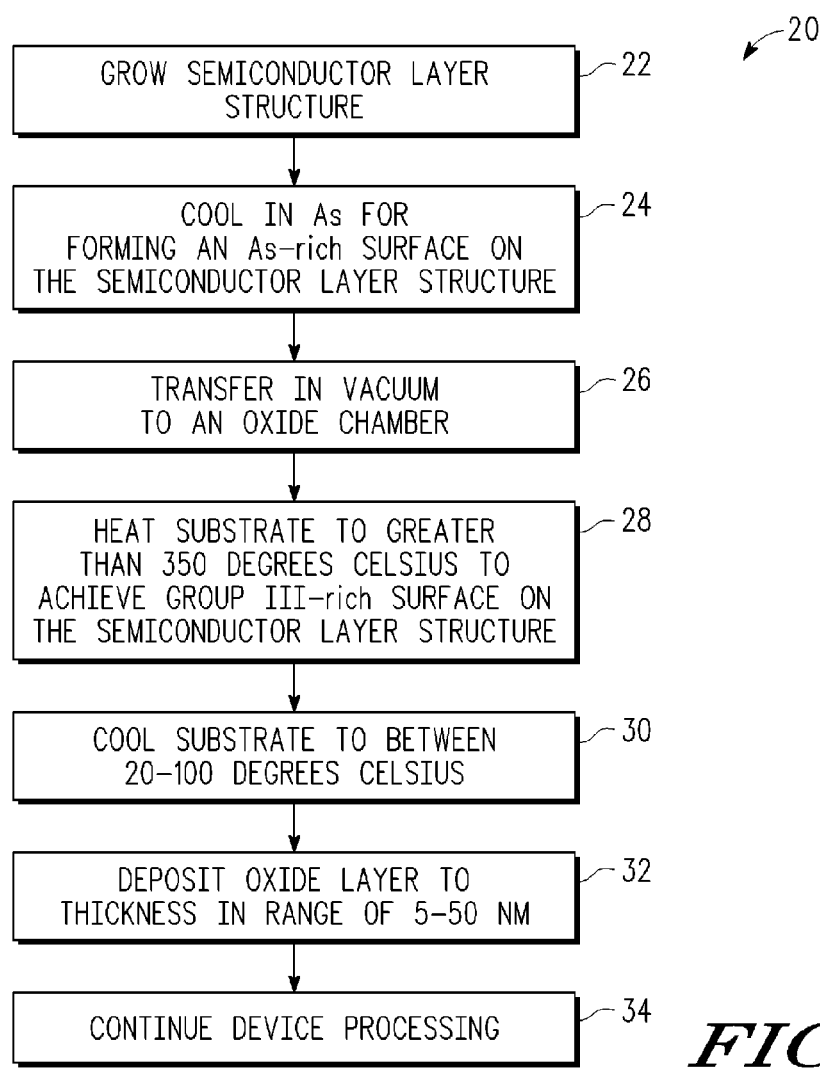
FIG. 2 is a flow diagram view of a method of making a compound semiconductor structure in accordance with one exemplary embodiment of the present disclosure.

FIG. 2 is a flow diagram view of a method 20 of making a compound semiconductor structure in accordance with one exemplary embodiment of the present disclosure. In particular, method 20 is specific to the formation of a semiconductor layer structure of InGaAs with a group-III surface termination layer. In step 22, a semiconductor layer structure is grown overlying a substrate, using any suitable techniques, for example, MBE, MOCVD, etc., according to the requirements of a given compound semiconductor structure application. In one embodiment, the substrate comprises InP and the semiconductor layer structure includes InGaAs.

In step 24, the grown semiconductor layer structure is then cooled in an arsenic (As) ambient to form an As-rich (3×2) surface (i.e., the surface of the surface termination layer) on the semiconductor layer structure, wherein the surface includes mostly As atoms (group V-rich). In one embodiment, step 24 immediately follows a desired growth of the layers of the semiconductor layer structure, and wherein all sources used in the growth of the semiconductor layer structure other than As are turned off and the As is allowed to continue to flow for a duration sufficient to form the desired As-rich surface. Furthermore, in one embodiment, the As-rich surface is on the order of a mono-layer. It is noted that the mono-layer of As is highly susceptible to undesirable degradation in ambient air.

In step 26, the substrate with the semiconductor layer structure having the As-rich surface is transferred in vacuum to an oxide deposition chamber. Accordingly, the substrate is transferred into the oxide deposition chamber with a well ordered clean surface being preserved.

In step 28, the substrate with the semiconductor layer structure having the As-rich surface is then heated to a temperature greater than 350 degrees Celsius to achieve group III-rich (4×2) surface reconstruction (i.e., a group III-rich surface of the surface termination layer) on the semiconductor layer structure. The heating in step 28 is sufficient to cause the As of the surface termination layer to dissipate from the surface. The remaining surface of the surface termination layer is then group III-rich. In one embodiment, for the MBE process, the substrate temperature is increased in the range of 400-500 degrees Celsius where the InGaAs surface is characterized with a group III-rich (4×2) surface reconstruction.

In step 30, the substrate with the semiconductor layer structure having the group III-rich surface is cooled to a low temperature, for example, between 20 and 100 degrees Celsius. The process of reducing the temperature to between 20-100 degrees Celsius operates so as to "freeze" the group III-rich (4×2) surface reconstruction.

In step 32, while the substrate is still within the oxide chamber, an oxide layer is deposited overlying the group III-rich surface to a thickness in a range on the order of 5 to 50 nm. In one embodiment, the oxide layer comprises a ternary oxide layer. For example, with respect to the InP-based MOSFET device, the ternary oxide can easily be evaporated congruently during e-beam deposition. In one embodiment, the ternary oxide layer comprises $GdScO_3$ and is deposited by e-beam evaporation. The ternary oxide may also be deposited via other suitable methods, for example, thermal evaporation or by using combinations of binary oxide, metallic fluxes and oxygen. In addition, other suitable ternary oxides that can be congruently evaporated by electron beam deposition could also be used, including, but not limited to, $LaAlO_3$, $LaScO_3$, $LaLuO_3$, $PrLuO_3$ and $DyScO_3$.

In step 34, the substrate is subjected to continued device processing, for example, to form gate metal electrode and ohmic contacts according to the particular requirements of the given compound semiconductor structure application.

In an alternate embodiment, subsequent to step 32 and prior to step 34, the substrate with the semiconductor layer structure having the group III-rich surface termination layer with the required oxide layer is annealed in a suitable ambient. The ambient is selected to advantageously improve an interface between the oxide and the surface termination layer, achieve densification the oxide, and improve electrical properties of the oxide. In one embodiment, the annealing ambient comprises an oxygen ambient. The annealing step further includes annealing at a temperature greater than 350 degrees Celsius for a given time duration. In one embodiment, the in-situ anneal comprises a temperature in the range 400-600 degrees Celsius for 0.5-10 minutes in an oxygen environment having a flow rate on the order of between 0.5-5.0 sccm.

Figure 3:
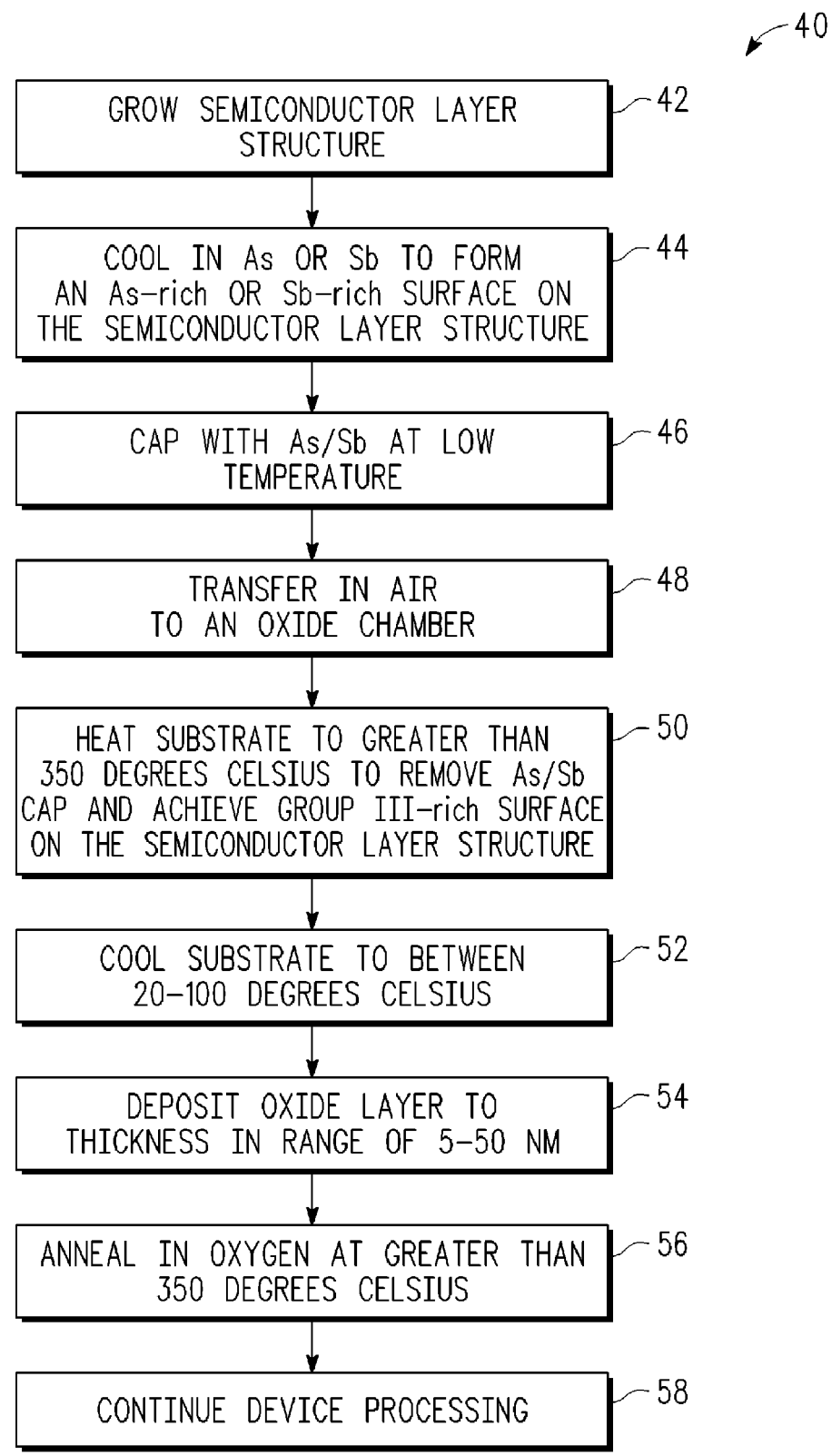
FIG. 3 is a flow diagram view of a method of making a compound semiconductor structure in accordance with one exemplary embodiment of the present disclosure.

FIG. 3 is a flow diagram view of a method of making a compound semiconductor structure in accordance with one exemplary embodiment of the present disclosure. In particular, method 40 is specific to the formation of a semiconductor layer structure of InGaAs, InSb, GaSb, InAs, the like, and combinations of the same with a group III-rich surface termination layer. In step 42, a semiconductor layer structure is grown overlying a substrate, using any suitable techniques, according to the requirements of a given compound semiconductor structure application. In one embodiment, the substrate comprises InP and the semiconductor layer structure includes InGaAs.

In step 44, the grown semiconductor layer structure is then cooled in an arsenic (As) or antimony (Sb) ambient to form an As-rich or Sb-rich (4×3) surface, respectively, (i.e., the surface of the surface termination layer) on the semiconductor layer structure, wherein the surface includes mostly As or Sb atoms. In one embodiment, step 44 immediately follows a desired growth of the layers of the semiconductor layer structure, and wherein all sources used in the growth of the semiconductor layer structure other than As or Sb are turned off and the As or Sb is allowed to continue to flow for a duration sufficient to form the desired As-rich or Sb-rich surface, respectively. Furthermore, in one embodiment, the As-rich or Sb-rich surface is on the order of a mono-layer.

It is noted that the mono-layer of As or Sb is highly susceptible to undesirable degradation in ambient air. Accordingly, in step 46, the substrate with the semiconductor layer structure having the As-rich or Sb-rich (group V-rich) surface is capped with a layer of arsenic (As), a layer of antimony (Sb), or a combination of As and Sb at low temperature, for example, between 0 and 100 degrees Celsius. In step 48, the As/Sb capped substrate with semiconductor layer structure can be transferred in an air ambient to an oxide chamber.

In step 50, the substrate with the semiconductor layer structure having the As/Sb capped As/Sb-rich surface is then heated to a temperature greater than 350 degrees Celsius to remove the As/Sb cap and to achieve a group III-rich (4×2) surface reconstruction (i.e., a group III-rich surface of the surface termination layer) on the semiconductor layer structure. The heating in step 50 is sufficient to cause the As/Sb cap and the As/Sb of the surface termination layer to dissipate from the surface. The remaining surface of the surface termination layer is then group III-rich. In step 52, the substrate with the semiconductor layer structure having the group III-rich surface is cooled to a low temperature, for example, between 20 and 100 degrees Celsius. In step 54, while the substrate is still within the oxide chamber, an oxide layer is deposited overlying the group III-rich surface to a thickness in a range on the order of 5 to 50 nm, similarly as discussed herein above with respect to FIG. 2.

In step 56, the substrate with the semiconductor layer structure having the group III-rich surface termination layer with the required oxide layer is annealed in a suitable ambient. The ambient is selected to advantageously improve an interface between the oxide and the surface termination layer, achieve densification the oxide, and improve electrical properties of the oxide. In one embodiment, the annealing ambient comprises an oxygen ambient. The annealing step further includes annealing at a temperature greater than 350 degrees Celsius for a given time duration. In step 58, the substrate is then subjected to continued device processing, for example, to form gate metal electrode and ohmic contacts according to the particular requirements of the given compound semiconductor structure application. In an alternate embodiment, the anneal of step 56 is not carried out, wherein step 58 follows immediately after step 54.

Figure 4:
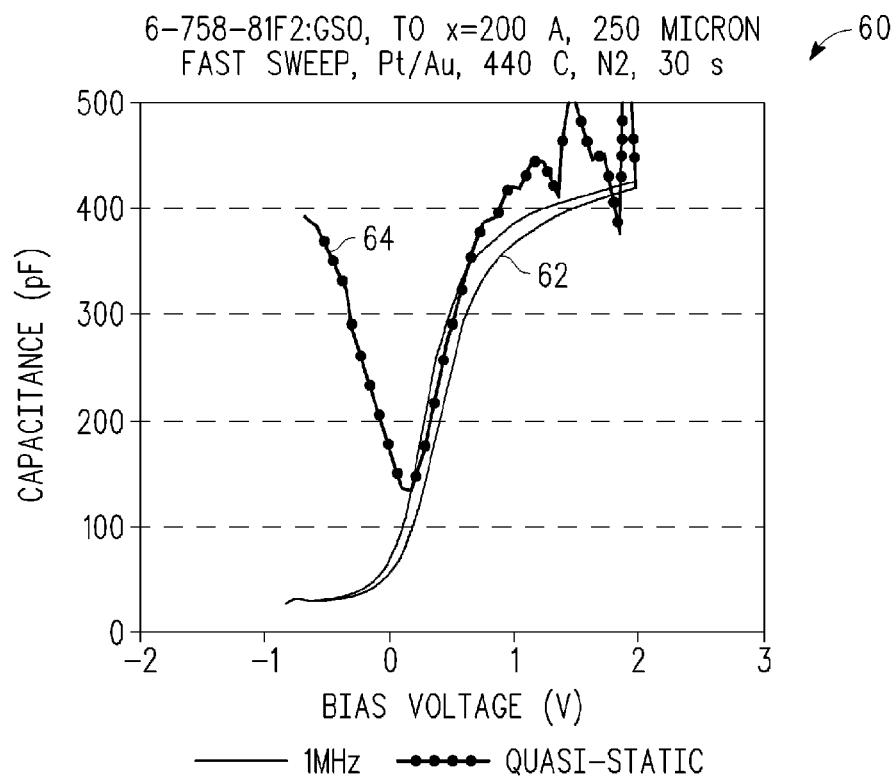
FIG. 4 is a graphical representation view of capacitance (pF) versus bias voltage (V) curves for a MOSFET device featuring a ternary oxide layer overlying a group III-rich surface termination InGaAs layer on InP according to one embodiment of the present disclosure for 1 MHz and quasi-static modes of operation.

FIG. 4 is a graphical representation view of capacitance (pF) versus bias voltage (V) curves for a MOSFET device featuring a ternary oxide layer overlying a group III-rich surface termination InGaAs layer on InP according to one embodiment of the present disclosure for 1 MHz and quasi-static modes of operation. FIG. 4 shows a capacitance-voltage measurement of an N-type $In_{0.53}Ga_{0.47}As/InP$ structure with a 20 nm $GdScO_3$ dielectric layer deposited in accordance with the methods of the present disclosure. Two measurement techniques were used to obtain the data of FIG. 4. One measurement technique included a 1 MHz high frequency measurement technique and the other included a quasi-static measurement technique. Both high frequency (1 MHz, lines 62, clockwise hysteresis) and quasi-static curves (line 64) suggest an unpinned Fermi level with low interfacial defects. In comparison, prior art $GdGaO/Ga_2O_3$ dielectric stacks on InGaAs had significantly higher interface defect density and large positive interfacial charge.

Figure 5:
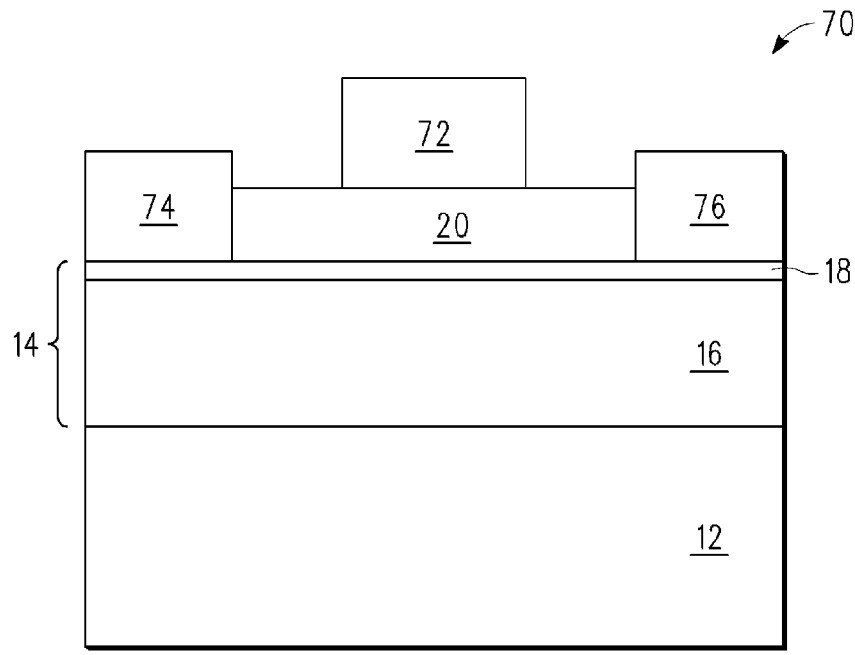
FIG. 5 is a schematic view, in cross section, of an enhancement mode compound semiconductor device in accordance with one exemplary embodiment of the present disclosure.

FIG. 5 is a schematic view, in cross section, of an enhancement mode compound semiconductor device in accordance with one exemplary embodiment of the present disclosure. Device 70 includes the semiconductor structure 10 as discussed herein with respect to FIG. 1. Device 70 further includes a metal gate electrode 72 and source and drain ohmic contacts (74,76). In particular, metal gate electrode 72 comprises a metal gate electrode that is stable in the presence of the gate dielectric material (or gate oxide material) and overlies gate dielectric layer 20. The material for metal gate electrode 72 comprises any suitable material selected for providing a given work function such that for a particular MOSFET configuration enhancement mode operation is achieved.

Source and drain ohmic contacts 74, 76 are formed overlying surface termination layer 18 of the semiconductor layer structure 14 and are separated from metal gate electrode 72 by source and drain access regions. Source and drain access regions comprise those areas of structure 10 laterally disposed between the source ohmic contact 74 and metal gate electrode 72 and between drain ohmic contact 76 and metal gate electrode 72, respectively. Source and drain ohmic contacts 74, 76 may be formed of any suitable electrically conductive material as is known in the semiconductor industry.

Enhancement mode operation of device 70 may be realized based on a relationship between the work function of metal gate electrode 72 and the dopant level of doped layers within the semiconductor layer structure 14. While the doped layers of the semiconductor layer structure 14 serve as a source for free carriers, thus eliminating the need for ion-implanted source and drain extensions within structure 10, without a suitable metal gate electrode, the doped layers may adversely shift the threshold voltage of device 70 preventing enhancement mode operation.

As discussed herein, in one embodiment, gate dielectric fabrication includes depositing the ternary oxide layer using electron beam evaporation. In alternate embodiments, the deposition of the ternary gate dielectric layer comprises using combinations of binary oxide, metallic fluxes and oxygen. Such processes for gate dielectric fabrication are also applicable to In-containing compound semiconductors including, $In_xGa_{1-x}As$ (0<x<1), InAs, InSb, $InAs_xSb_{1-x}$ (0<x<1), InN, $In_xGa_{1-x}N$ (0<x<1) and combination thereof.

The embodiments of the present disclosure advantageously provide a MOSFET having a gate dielectric stack for In-containing compound semiconductors that provide required properties for improved performance. In other words, the embodiments of the present disclosure advantageously unpin the Fermi level and reduce the density of interface states within the MOSFET structure which is necessary for enhancement mode MOSFET operation.

According to one embodiment, the method includes using a single layer dielectric deposited on a group III-rich semiconductor surface. In one embodiment, the single layer dielectric comprises a ternary oxide. The oxide has the properties that it can be deposited stoichiometrically on the semiconductor surface by e-beam evaporation. Examples include $GdScO_3$, $LaScO_3$, $LaAlO_3$, $LaLuO_3$, $PrLuO_3$, $DyScO_3$.

In addition, the method according to the embodiments of the present disclosure includes putting oxide molecules into the gas phase, depositing oxide molecules on the group III-rich surface, wherein the oxide molecules originate from evaporation of ternary oxides. In contrast, prior techniques use metal to put metal atoms into the gas phase, depositing metal atoms on the semiconductor surface, and then heat the material in the presence of oxygen to oxidize the surface of the material. Important to the embodiments of the present disclosure is the oxide molecules in the gas phase, wherein the oxide molecules are placed in the gas phase by e-beam evaporation, thermal evaporation, MOCVD, or other suitable method.

By now it should be appreciated that there has been provided a method of forming a portion of a compound semiconductor MOSFET structure comprising: forming a compound semiconductor layer structure that includes at least one channel material and a surface termination layer overlying the at least one channel material, wherein the surface termination layer includes a surface; and forming an oxide layer overlying the surface termination layer of the compound semiconductor layer structure, wherein forming the oxide layer comprises one of (a) depositing essentially congruently evaporating oxide of at least one of (a(i)) a ternary oxide and (a(ii)) an oxide more complex than a ternary oxide and (b) depositing oxide molecules of at least one of (b(i)) a ternary oxide and (b(ii)) an oxide more complex than a ternary oxide. In one embodiment, the surface termination layer includes a group III-rich surface. The group III-rich surface further comprises of one selected from the group consisting of an indium-rich (In-rich) surface, a gallium-rich (Ga-rich) surface, and a combination of In-rich and Ga-rich surface.

According to another embodiment, forming the oxide layer further comprises depositing the essentially congruently evaporating one of a ternary oxide and an oxide more complex than a ternary oxide using e-beam deposition. In yet another embodiment, forming the oxide layer further comprises depositing oxide molecules of one of a ternary oxide and an oxide more complex than a ternary oxide by putting oxide molecules in a gas phase, further wherein putting oxide molecules in the gas phase comprises one selected from (i) e-beam evaporation and (ii) MOCVD, the oxide molecules further being bound to a more complex molecule with MOCVD.

In a further embodiment, the at least one channel material comprises one selected from the group consisting of indium based channel materials, antimony based channel materials, gallium based channel materials, and combinations of indium, antimony, and gallium based channel materials.

In another embodiment, the compound semiconductor layer structure comprises an In-containing compound semiconductor layer structure in which the at least one channel material includes indium based channel materials. The compound semiconductor layer structure can comprise, for example, one of indium gallium arsenide (InGaAs) and indium arsenide (InAs). In yet another embodiment, the compound semiconductor layer structure comprises an Sb-containing compound semiconductor layer structure in which the at least one channel material includes antimony based channel materials. The compound semiconductor layer structure comprises, for example, one of indium antimonide (InSb), indium arsenide antimonide (InAsSb) and gallium antimonide (GaSb).

In a further embodiment, the surface termination layer can comprise one of a mono-layer, a fraction of a monolayer, and a portion of a mono-layer. Still further, forming the oxide layer can include forming one selected from the group consisting of $GdScO_3$, $LaScO_3$, $LaAlO_3$, $LaLuO_3$, $PrLuO_3$, and $DyScO_3$.

According to another embodiment, a method of forming a portion of a semiconductor MOSFET structure comprises: growing a semiconductor layer structure overlying a substrate, wherein the semiconductor layer structure includes at least one channel material, wherein the at least one channel material comprises one selected from the group consisting of indium based channel materials, antimony based channel materials, gallium based channel materials, and combinations of indium, antimony, and gallium based channel materials; cooling the grown semiconductor layer structure in one of an arsenic (As) ambient and an antimony (Sb) ambient to form one of an As-rich surface and an Sb-rich surface, respectively, on the semiconductor layer structure, wherein the As-rich or Sb-rich surface is on the order of a mono-layer; transferring the substrate with the semiconductor layer structure having the As-rich or Sb-rich surface to an oxide deposition chamber; heating the substrate with the semiconductor layer structure having the As-rich or Sb-rich surface to a temperature greater than 350 degrees Celsius to achieve a group III-rich surface reconstruction on the semiconductor layer structure, wherein the heating is sufficient to cause the As or Sb of the surface termination layer to dissipate from the surface such that a remaining surface of the surface termination layer comprises the group III-rich surface reconstruction; cooling the substrate with the semiconductor layer structure having the group III-rich surface to a low temperature between 20 and 100 degrees Celsius, wherein the process of reducing the temperature to between 20-100 degrees Celsius operates so as to "freeze" the group III-rich surface reconstruction; and depositing an oxide layer overlying the group III-rich surface to a thickness in a range on the order of 5 to 50 nm while the substrate is still within the oxide chamber, wherein depositing the oxide layer comprises one of (a) depositing essentially congruently evaporating oxide of at least one of (a(i)) a ternary oxide and (a(ii)) an oxide more complex than a ternary oxide and (b) depositing oxide molecules of at least one of (b(i)) a ternary oxide and (b(ii)) an oxide more complex than a ternary oxide a ternary or more complex oxide.

In a further embodiment, depositing the oxide layer further comprises depositing the essentially congruently evaporating one of a ternary oxide and an oxide more complex than a ternary oxide using e-beam deposition. The ternary oxide or the oxide more complex than the ternary oxide includes one or more of $GdScO_3$, $LaAlO_3$, $LaScO_3$, $LaLuO_3$, $PrLuO_3$ and $DyScO_3$. In yet another embodiment, depositing the oxide layer further comprises depositing oxide molecules of one of a ternary oxide and an oxide more complex than a ternary oxide by putting oxide molecules in a gas phase, further wherein putting oxide molecules in the gas phase comprises one selected from (i) e-beam evaporation and (ii) MOCVD, the oxide molecules further being bound to a more complex molecule with MOCVD. The ternary oxide can comprise, for example, $GdScO_3$ deposited by e-beam evaporation.

In still another embodiment, subsequent to forming the As-rich or Sb-rich surface on the semiconductor layer structure, and prior to transferring the substrate to the oxide deposition chamber, the method further comprises: capping the substrate with the semiconductor layer structure having the As-rich or Sb-rich surface at a temperature between 0 and 100 degrees Celsius with one selected from the group consisting of arsenic (As), antimony (Sb), and a combination of arsenic (As) and antimony (Sb).

According to another embodiment, an enhancement mode metal-oxide semiconductor field effect transistor (EMOSFET) comprises: a compound semiconductor layer structure overlying a substrate, the semiconductor layer structure including at least one channel material and a surface termination layer overlying the at least one channel material, wherein the surface termination layer includes a group III-rich surface; a gate oxide layer overlying the group III-rich surface of the surface termination layer of the compound semiconductor layer structure, wherein the gate oxide layer comprises a layer formed by one of (a) depositing essentially congruently evaporating oxide of at least one of (a(i)) a ternary oxide and (a(ii)) an oxide more complex than a ternary oxide and (b) depositing oxide molecules of at least one of (b(i)) a ternary oxide and (b(ii)) an oxide more complex than a ternary oxide; a metal gate electrode overlying the gate oxide layer; and source and drain ohmic contacts laterally disposed from the gate electrode and overlying corresponding portions of the surface termination layer. In addition, the oxide layer includes one selected from the group consisting of $GdScO_3$, $LaScO_3$, $LaAlO_3$, $LaLuO_3$, $PrLuO_3$, and $DyScO_3$. Furthermore, the gate oxide layer further comprises an ambient anneal processed layer.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the method can be applied to compound semiconductor power amplifiers, RF device technologies, high scale CMOS, and other semiconductor device applications. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a portion of a compound semiconductor MOSFET structure comprising:
    forming a compound semiconductor layer structure that includes at least one channel material and a surface termination layer overlying the at least one channel material, wherein the surface termination layer includes a surface; and
    forming an oxide layer overlying the surface termination layer of the compound semiconductor layer structure, wherein forming the oxide layer comprises one of
        (a) depositing essentially congruently evaporating oxide of at least one of (a(i)) a ternary oxide and (a(ii)) an oxide more complex than a ternary oxide and
        (b) depositing oxide molecules of at least one of (b(i)) a ternary oxide and (b(ii)) an oxide more complex than a ternary oxide.

2. A method of forming a portion of a semiconductor MOSFET structure comprising:
   growing a semiconductor layer structure overlying a substrate, wherein the semiconductor layer structure includes at least one channel material, wherein the at least one channel material comprises one selected from the group consisting of indium based channel materials, antimony based channel materials, gallium based channel materials, and combinations of indium, antimony, and gallium based channel materials;
   cooling the grown semiconductor layer structure in one of an arsenic (As) ambient and an antimony (Sb) ambient to form one of an As-rich surface and an Sb-rich surface, respectively, on the semiconductor layer structure, wherein the As-rich or Sb-rich surface is on the order of a mono-layer;
   transferring the substrate with the semiconductor layer structure having the As-rich or Sb-rich surface to an oxide deposition chamber;
   heating the substrate with the semiconductor layer structure having the As-rich or Sb-rich surface to a temperature greater than 350 degrees Celsius to achieve a group III-rich surface reconstruction on the semiconductor layer structure, wherein the heating is sufficient to cause the As or Sb of the surface termination layer to dissipate from the surface such that a remaining surface of the surface termination layer comprises the group III-rich surface reconstruction;
   cooling the substrate with the semiconductor layer structure having the group III-rich surface to a low temperature between 20 and 100 degrees Celsius, wherein the process of reducing the temperature to between 20-100 degrees Celsius operates so as to "freeze" the group III-rich surface reconstruction; and
   depositing an oxide layer overlying the group III-rich surface to a thickness in a range on the order of 5 to 50 nm while the substrate is still within the oxide chamber, wherein depositing the oxide layer comprises one of
   (a) depositing essentially congruently evaporating oxide of at least one of (a(i)) a ternary oxide and (a(ii)) an oxide more complex than a ternary oxide and
   (b) depositing oxide molecules of at least one of (b(i)) a ternary oxide and (b(ii)) an oxide more complex than a ternary oxide a ternary or more complex oxide.

3. An enhancement mode metal-oxide semiconductor field effect transistor (EMOSFET) comprising:
   a compound semiconductor layer structure overlying a substrate, the semiconductor layer structure including at least one channel material and a surface termination layer overlying the at least one channel material, wherein the surface termination layer includes a group III-rich surface;
   a gate oxide layer overlying the group III-rich surface of the surface termination layer of the compound semiconductor layer structure, wherein the gate oxide layer comprises a layer formed by one of (a) depositing essentially congruently evaporating oxide of at least one of (a(i)) a ternary oxide and (a(ii)) an oxide more complex than a ternary oxide and (b) depositing oxide molecules of at least one of (b(i)) a ternary oxide and (b(ii)) an oxide more complex than a ternary oxide;
   a metal gate electrode overlying the gate oxide layer; and
   source and drain ohmic contacts laterally disposed from the gate electrode and overlying corresponding portions of the surface termination layer.

4. The method of claim 1, wherein the surface termination layer includes a group III-rich surface.

5. The method of claim 1, wherein forming the oxide layer further comprises depositing the essentially congruently evaporating one of a ternary oxide and an oxide more complex than a ternary oxide using e-beam deposition.

6. The method of claim 1, wherein forming the oxide layer further comprises depositing oxide molecules of one of a ternary oxide and an oxide more complex than a ternary oxide by putting oxide molecules in a gas phase, further wherein putting oxide molecules in the gas phase comprises one selected from (i) e-beam evaporation and (ii) MOCVD, the oxide molecules further being bound to a more complex molecule with MOCVD.

7. The method of claim 1, wherein the at least one channel material comprises one selected from the group consisting of indium based channel materials, antimony based channel materials, gallium based channel materials, and combinations of indium, antimony, and gallium based channel materials.

8. The method of claim 1, wherein the compound semiconductor layer structure comprises an In-containing compound semiconductor layer structure in which the at least one channel material includes indium based channel materials.

9. The method of claim 1, wherein the compound semiconductor layer structure comprises an Sb-containing compound semiconductor layer structure in which the at least one channel material includes antimony based channel materials.

10. The method of claim 1, wherein the surface termination layer comprises one of a mono-layer, a fraction of a mono-layer, and a portion of a mono-layer.

11. The method of claim 1, further wherein forming the oxide layer includes forming one selected from the group consisting of $GdScO_3$, $LaScO_3$, $LaAlO_3$, $LaLuO_3$, $PrLuO_3$, and $DyScO_3$.

12. The method of claim 4, wherein the group III-rich surface further comprises of one selected from the group consisting of an indium-rich (In-rich) surface, a gallium-rich (Ga-rich) surface, and a combination of In-rich and Ga-rich surface.

13. The method of claim 8, further wherein the compound semiconductor layer structure comprises one of indium gallium arsenide (InGaAs) and indium arsenide (InAs).

14. The method of claim 9, further wherein the compound semiconductor layer structure comprises one of indium antimonide (InSb), indium arsenide antimonide (InAsSb) and gallium antimonide (GaSb).

15. The method of claim 2, wherein depositing the oxide layer further comprises depositing the essentially congruently evaporating one of a ternary oxide and an oxide more complex than a ternary oxide using e-beam deposition.

16. The method of claim 2, wherein depositing the oxide layer further comprises depositing oxide molecules of one of a ternary oxide and an oxide more complex than a ternary oxide by putting oxide molecules in a gas phase, further wherein putting oxide molecules in the gas phase comprises one selected from (i) e-beam evaporation and (ii) MOCVD, the oxide molecules further being bound to a more complex molecule with MOCVD.

17. The method of claim 2, wherein subsequent to forming the As-rich or Sb-rich surface on the semiconductor layer structure, and prior to transferring the substrate to the oxide deposition chamber, the method further comprising:
   capping the substrate with the semiconductor layer structure having the As-rich or Sb-rich surface at a temperature between 0 and 100 degrees Celsius with one selected from the group consisting of arsenic (As), antimony (Sb), and a combination of arsenic (As) and antimony (Sb).

18. The method of claim 15, wherein the ternary oxide or the oxide more complex than the ternary oxide includes one or more of $GdScO_3$, $LaAlO_3$, $LaScO_3$, $LaLuO_3$, $PrLuO_3$ and $DyScO_3$.

19. The method of claim 16, wherein the ternary oxide comprises $GdScO_3$ deposited by e-beam evaporation.

20. The device of claim 3, wherein the oxide layer includes one selected from the group consisting of $GdScO_3$, $LaScO_3$, $LaAlO_3$, $LaLuO_3$, $PrLuO_3$, and $DyScO_3$, and wherein the gate oxide layer further comprises an ambient anneal processed layer.

* * * * *